US010453736B2

(12) United States Patent
Chao et al.

(10) Patent No.: US 10,453,736 B2
(45) Date of Patent: Oct. 22, 2019

(54) DIELECTRIC ISOLATION IN GATE-ALL-AROUND DEVICES

(71) Applicant: International Business Machines Corporation, Armonk, NY (US)

(72) Inventors: Robin Hsin Kuo Chao, Cohoes, NY (US); Kangguo Cheng, Schenectady, NY (US); Nicolas Loubet, Guilderland, NY (US); Pietro Montanini, Albany, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/727,974

(22) Filed: Oct. 9, 2017

(65) Prior Publication Data

US 2019/0109040 A1    Apr. 11, 2019

(51) Int. Cl.
*H01L 21/762* (2006.01)
*H01L 29/66* (2006.01)
*H01L 29/40* (2006.01)
*H01L 29/06* (2006.01)
*H01L 29/423* (2006.01)
*H01L 29/78* (2006.01)

(52) U.S. Cl.
CPC .... *H01L 21/76224* (2013.01); *H01L 29/0653* (2013.01); *H01L 29/40* (2013.01); *H01L 29/42392* (2013.01); *H01L 29/6653* (2013.01); *H01L 29/6681* (2013.01); *H01L 29/66439* (2013.01); *H01L 29/66553* (2013.01); *H01L 29/7853* (2013.01)

(58) Field of Classification Search
CPC .......... H01L 21/76224; H01L 29/0653; H01L 29/40
See application file for complete search history.

(56) References Cited

U.S. PATENT DOCUMENTS

| 9,620,590 | B1 | 4/2017 | Bergendahl et al. |
| 9,620,607 | B2 | 4/2017 | Huang et al. |
| 9,691,851 | B1* | 6/2017 | Fung .................... H01L 29/0684 |
| 2016/0079422 | A1 | 3/2016 | Rachmady et al. |
| 2016/0190272 | A1 | 6/2016 | Su et al. |
| 2016/0293774 | A1 | 10/2016 | Then et al. |
| 2017/0018624 | A1 | 1/2017 | Sun et al. |
| 2017/0117359 | A1 | 4/2017 | Cheng et al. |
| 2017/0179248 | A1 | 6/2017 | Pawlak |
| 2018/0163130 | A1* | 6/2018 | Kim ...................... H01L 29/423 |

* cited by examiner

*Primary Examiner* — Errol V Fernandes
(74) *Attorney, Agent, or Firm* — Garg Law Firm, PLLC; Rakesh Garg; Grant Johnson

(57) ABSTRACT

A semiconductor device is fabricated with a first layer of a first sacrificial material deposited over a surface of a substrate. A first set of layers of a second sacrificial material and a second set of layers of a channel material are deposited over the first layer. A liner is deposited in a first recess, which exposes a first connection end of a layer in the second set, where the first recess reaches into the substrate for at least a fraction of a total depth of the substrate. An insulator material is filled in the first recess and etched up to a stop depth, stopping the etching at a height above the surface of the substrate. The liner is removed from at least the first connection end of the layer in the second set. An electrical connection is formed with a source/drain structure using the first connection end.

18 Claims, 17 Drawing Sheets

US 10,453,736 B2

DIELECTRIC ISOLATION IN GATE-ALL-AROUND DEVICES

TECHNICAL FIELD

The present invention relates generally to a semiconductor device, a fabrication method, and fabrication system for reducing the substrate current in gate-all-around (GAA) semiconductor devices. More particularly, the present invention relates to a device, method, and system for dielectric isolation in GAA devices.

BACKGROUND

An integrated circuit (IC) is an electronic circuit formed using a semiconductor material, such as Silicon, as a substrate and by adding impurities to form solid-state semiconductor electronic devices (device, devices), such as transistors, diodes, capacitors, and resistors. Any reference to a "device" herein refers to a solid-state semiconductor electronic device unless expressly distinguished where used.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

A device generally uses several layers of different materials to implement the device properties and function. A layer of material can be conductive, semi-conductive, insulating, resistive, capacitive, or have any number of other properties. Different layers of materials have to be formed using different methods, given the nature of the material, the shape, size or placement of the material, other materials adjacent to the material, and many other considerations.

The software tools used for designing ICs produce, manipulate, or otherwise work with the circuit layout and circuit components on very small scales. Some of the components that such a tool may manipulate may only measure a few nanometers across when formed in Silicon. The designs produced and manipulated using these software tools are complex, often including hundreds of thousands of such components interconnected to form an intended electronic circuitry.

A Field Effect Transistor (FET) is a semiconductor device that controls the electrical conductivity between a source of electric current (source, "S") and a destination of the electrical current (drain, "D"). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication. A fin-Field Effect Transistor (finFET) is a non-planar device in which a source and a drain are connected using a fin-shaped conducting channel (fin).

In a FET, a gate controls the current flow between a source and a drain—i.e., between two S/Ds—through the fin. The direction of a channel running from one S/D to the other S/D is referred to herein as a channel direction. For the clarity of the description and without implying any limitation thereto, and using the X, Y, Z axes of the coordinate system, the substrate is imagined to be running in an X-Z horizontal plane with the depth of the substrate being in the Y direction, and the fin runs in a vertical Y-Z plane with the width of the fin being in the X direction.

A GAA device includes one or more channels through such that the gate surrounds channel completely in all directions except leaving open the ends of the channel for connections to the source and drain. As an example, if imagined as a pipe, the open ends of the pipe connect to the source and the drain and the gate covers the external surface of the pipe. The gate may cover the surface along the entire length of the pipe (channel) or only a portion of the length of the pipe (channel).

When a GAA device includes multiple channels, each channel can be imagined as a pipe where the set of pipes all run in the same direction from the same source to the same drain. In a GAA device with multiple channels—as used in a non-limiting way to depict and describe various embodiments herein—each channel (pipe) is separately and completely surrounded by the gate material along all or a part of the channel's length between the source and the drain.

SUMMARY

The illustrative embodiments provide a semiconductor device, and a method and system of fabrication therefor. A semiconductor device of an embodiment includes a first layer comprising a first sacrificial material, wherein the first layer is deposited, over a surface of a substrate. The embodiment further includes a first set of layers of a second sacrificial material and a second set of layers of a channel material deposited over the first layer. The embodiment further includes a liner deposited in a first recess, wherein the first recess exposes a first connection end of a layer in the second set, wherein the first recess reaches into the substrate for at least a fraction of a total depth of the substrate. The embodiment further includes an insulator material filling the first recess, wherein etching is performed on the insulator material up to a stop depth, wherein the stop depth stops the etching at a height above the surface of the substrate, wherein the liner is removed from at least the first connection end of the layer in the second set. The embodiment further includes an electrical connection formed with a source/drain structure using the first connection end of the layer in the second set, wherein a remaining portion of the insulator below the height and a remaining portion of the liner in the first recess impedes a current to flow from the source/drain structure to the substrate.

An embodiment includes a fabrication method for fabricating the semiconductor device.

An embodiment includes a fabrication system for fabricating the semiconductor device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
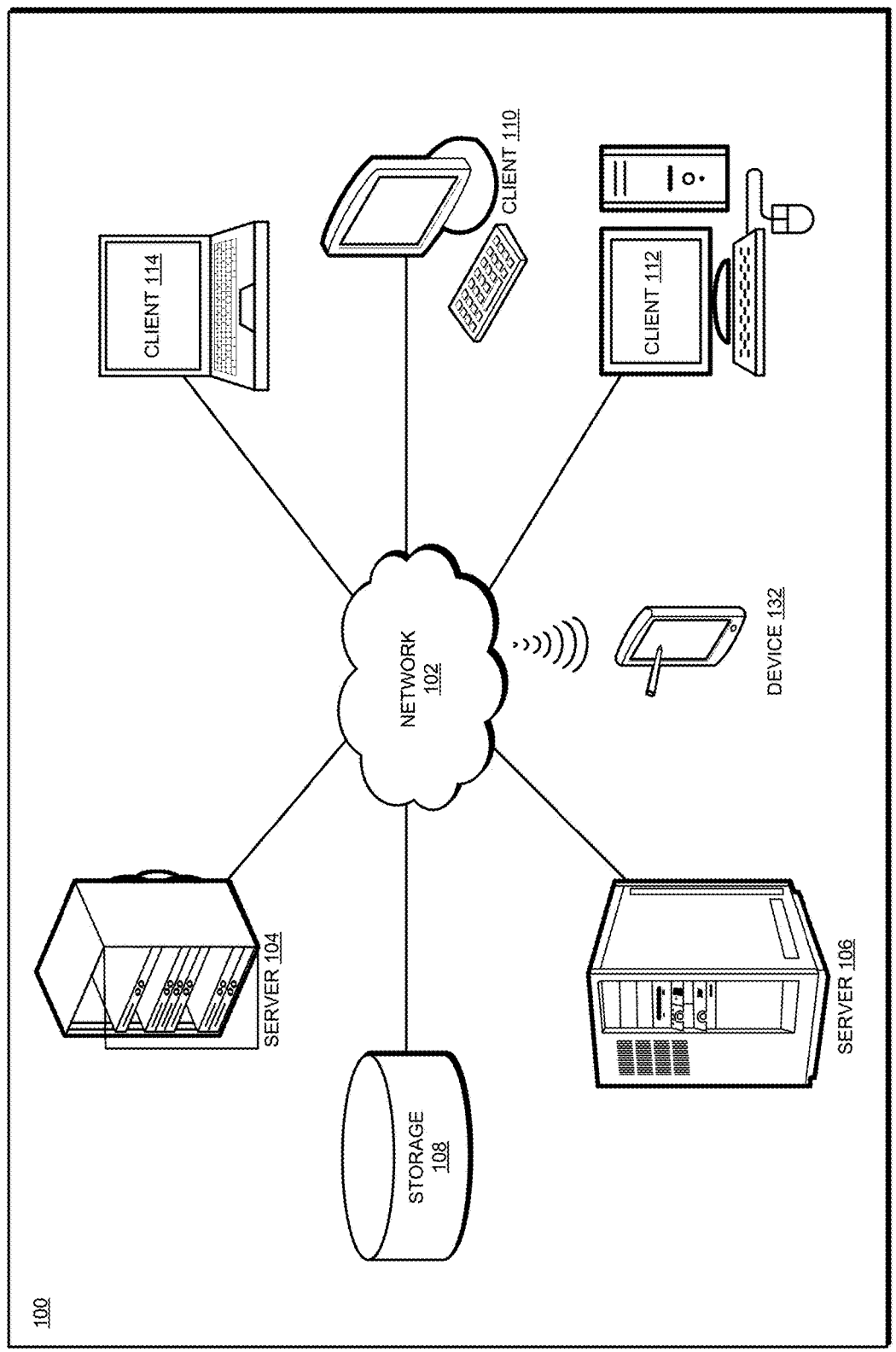
FIG. 1 depicts a block diagram of a network of data processing systems in which illustrative embodiments may be implemented.

The illustrative embodiments recognize that one of the problems in GAA devices is an unintended flow of current between the source and the drain through the dielectric material of the substrate, without passing through a channel, and without being subjected to the control of the gate. This undesirable current through the substrate is hereinafter referred to as "substrate current." Experiments have shown that when this current is inhibited, such as by applying a voltage to the substrate in an effort to draw electrons away from the substrate, the minimizing effect on the substrate current shows an improvement in the performance of the GAA device.

The illustrative embodiments recognize that the substrate current should be reduced or removed to improve the performance of the GAA device fabricated on the substrate. The illustrative embodiments further recognize that applying a voltage to the substrate is a less desirable way of reducing the substrate current than creating the GAA structures in a way that reduce the substrate current. Thus, the illustrative embodiments recognize that the structures of the GAA device should be constructed in such a manner that the substrate is electrically isolated to a substantial degree from the source, the drain, the gate, and the channels.

The illustrative embodiments used to describe the invention generally address and solve the above-described problems and other problems related to dielectric isolation in GAA devices. The illustrative embodiments provide a fabrication method for dielectric isolation in GAA devices.

An embodiment can be implemented as a software application. The application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate a GAA device in which the substrate current is significantly reduced, as described herein.

For the clarity of the description, and without implying any limitation thereto, the illustrative embodiments are described using a multi-channel GAA finFET where a single fin couples the S/D on one side of the fin to the S/D on the opposite side of the fin. An embodiment can be implemented with a different number of channels per fin, different number of fins, different directions of the fin (e.g., as in a vertical fin finFET), or both, within the scope of the illustrative embodiments. An embodiment can be implemented with other types of GAA channel devices, and such adaptations are contemplated herein.

Furthermore, a simplified diagram of the example GAA device is used in the figures and the illustrative embodiments. In an actual fabrication of a GAA device, additional structures that are not shown or described herein, or structures different from those shown and described herein, may be present without departing the scope of the illustrative embodiments. Similarly, within the scope of the illustrative embodiments, a shown or described structure in the example GAA device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar GAA devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating dielectric isolation in GAA devices. A manner of reducing the substrate current by constructing a structure in the GAA device is unavailable in the presently available methods. Thus, a substantial advancement of such devices or data processing systems by executing a method of an embodiment is in an improved fabrication of GAA devices where the device structurally inhibits or reduces the substrate current instead of an electrical voltage or bias being applied to the substrate.

The illustrative embodiments are described with respect to certain types of devices, electrical properties, structures, formations, layers orientations, directions, steps, operations, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
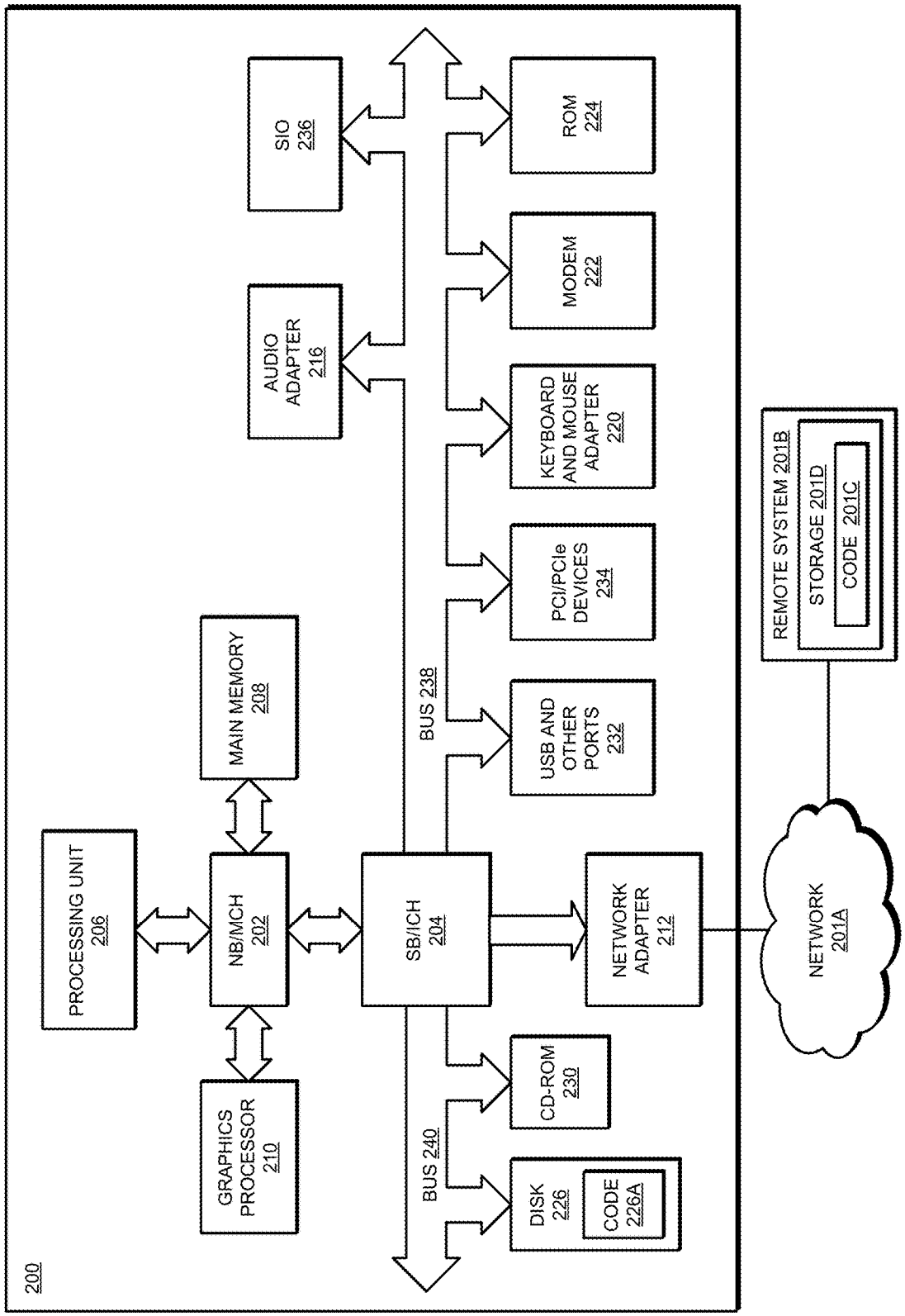
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a data processing device or a portable device usable for computing or communications purposes described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating a device, component, or structure, in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other data processing devices, such as mobile device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc.

licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different computer-components or data processing devices attached to the fabric or architecture.

A communications unit may include one or more communications-capable devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
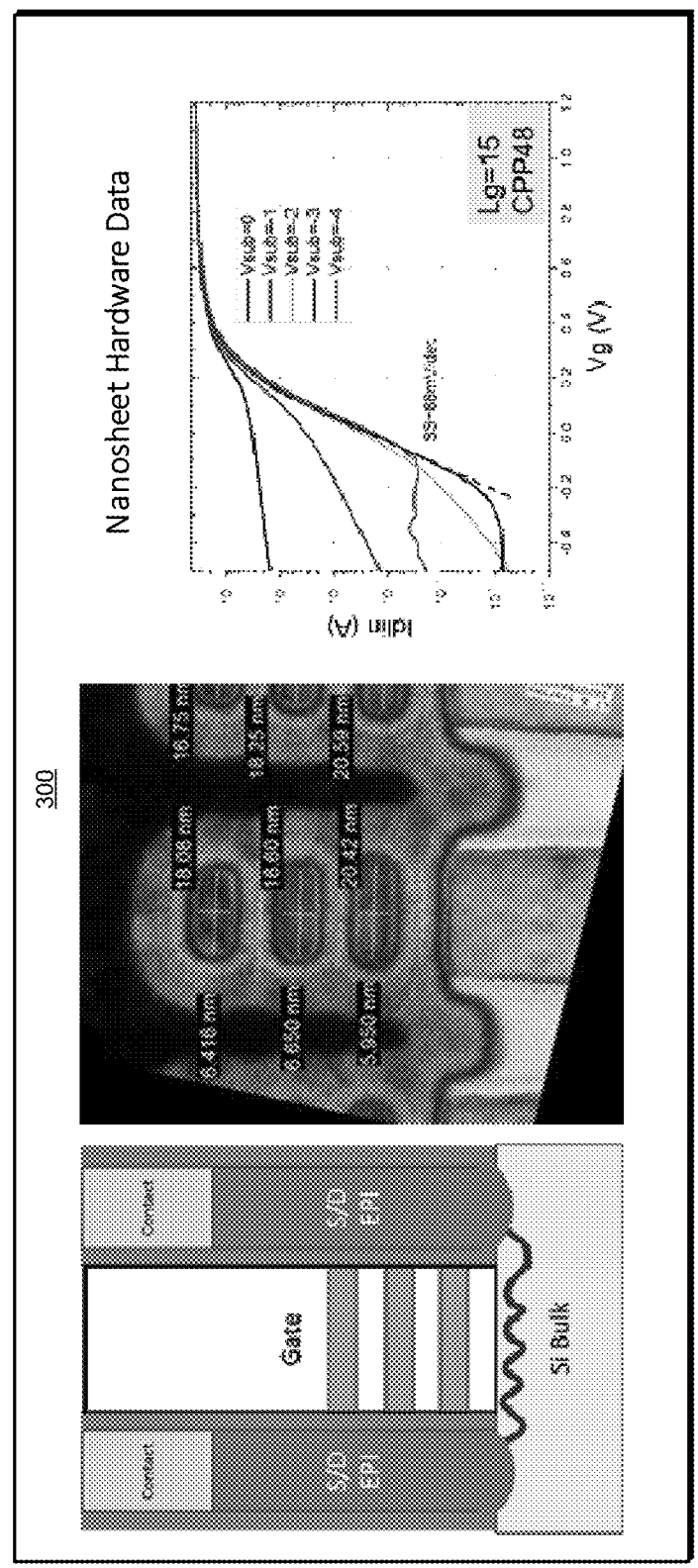
FIG. 3 depicts a prior-art GAA device and an experimental result of substrate current reduction via substrate bias, which can be improved with a structural improvement to provide substrate current minimization similar to but without using the substrate bias in accordance with an illustrative embodiment.

With reference to FIG. 3, this figure depicts a prior-art GAA device and an experimental result of substrate current reduction via substrate bias, which can be improved with a structural improvement to provide substrate current minimization similar to but without using the substrate bias in accordance with an illustrative embodiment. Device 302 is an example GAA device which uses S/D epitaxy (epi) 304 and 306. Either of epi 304 or 306 can operate as the source and the remaining of epi 304 and 306 operates as the drain. For example, contact 308 may be a metallic conducting material forming electrical connection to source (or drain) epi 304, and contact 310 may be a similar metallic conducting material forming electrical connection to drain (or source) epi 306.

Gate 312 and channels 314, 316, and 318 are fabricated over substrate 320. As can be seen in a two-dimensional cross-section on the X-Y plane, gate 312 surrounds channels 314, 316, and 318, thus forming Gate-All-Around device 302. As can also be seen, substrate 320 provides an unintended current path for substrate current 322 from epi 304 to epi 306 through substrate 320. Isolating substrate 320 from at least gate 320, and preferably from epi 304 epi 306 and gate 312, is desirable for the reasons described herein. The isolation of substrate 320 should be structurally accomplished such that the structure either (i) substantially increases the length of the path of substrate current 322 thereby increasing a resistance of the path and decreasing substrate current 322, or (ii) substantially block the path with a structure whose material presents a higher than a threshold resistance to substrate current 322, thereby reducing substrate current 322.

View 332 is a microscopic picture of an example actual GAA device where substrate 320 allows substrate current 322 to undesirably flow as described herein. View 332 is a cross-section across the Y-Z plane of the device shown in block schematic view 302. Channels 314, 316, and 318 are clearly visible surrounded by the material of gate 312. Gate 312 and channels 314-318 are formed over substrate 320, which allows the undesirable path for substrate current 322 as shown in view 332.

Graph 352 depicts the results of an experiment performed with device of view 332. When voltage Vsub is applied to substrate 320, the current flow between epi 304 and epi 306, through channels 314-318, switches from value A to value B. A lower (negative) value Vsub=0 plot shows a less distinct switch or change in the current value, as compared to the plots for Vsub=−1, Vsub=−2, Vsub=−3, and Vsub=−4 which show more pronounced switches from A to B. Thus, the higher the negative voltage of substrate 320 (to draw electrons away from substrate 320), the better the performance of the GAA device in view 332. This effect of Vsub should be achievable through structural modification of the device in view 332, as presented by one or more of the embodiments described herein.

Figure 4:
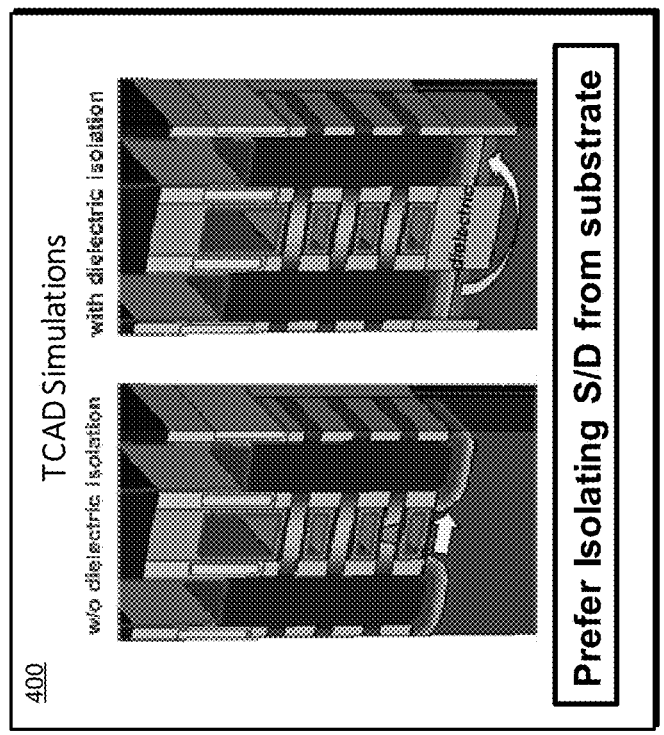
FIG. 4 depicts a block diagram of a comparative improvement provided by one type of structural improvement for dielectric isolation in GAA devices in accordance with an illustrative embodiment.

With reference to FIG. 4, this figure depicts a block diagram of a comparative improvement provided by one type of structural improvement for dielectric isolation in GAA devices in accordance with an illustrative embodiment. Configuration 402 is similar to configuration 302 or 332 in FIG. 3. Substrate current 422 is similar in value, impact on performance of device 402, and therefore undesirable in the manner of substrate current 322 in FIG. 3.

Configuration 452 is an improved configuration according to an illustrative embodiment. Configuration 452 adds structure 454 between the gate material and the substrate, e.g., between the bottom-most layer of gate material 312 and substrate 320 in FIG. 3. The material used to form structure 454 is a high-resistance dielectric material, and can be any of numerous materials with such properties as are known to those of ordinary skill in the art. The fabrication and placement of structure 454 where shown causes substrate current 456 to go around structure 454, thus significantly lengthening the path and weakening substrate current 456 to within a defined acceptable substrate current threshold. The performance of the device depicted in configuration 452 mimics the pronounced channel current switches, for example, as shown for Vsub=−3 in graph 352 of FIG. 3.

Figure 5:
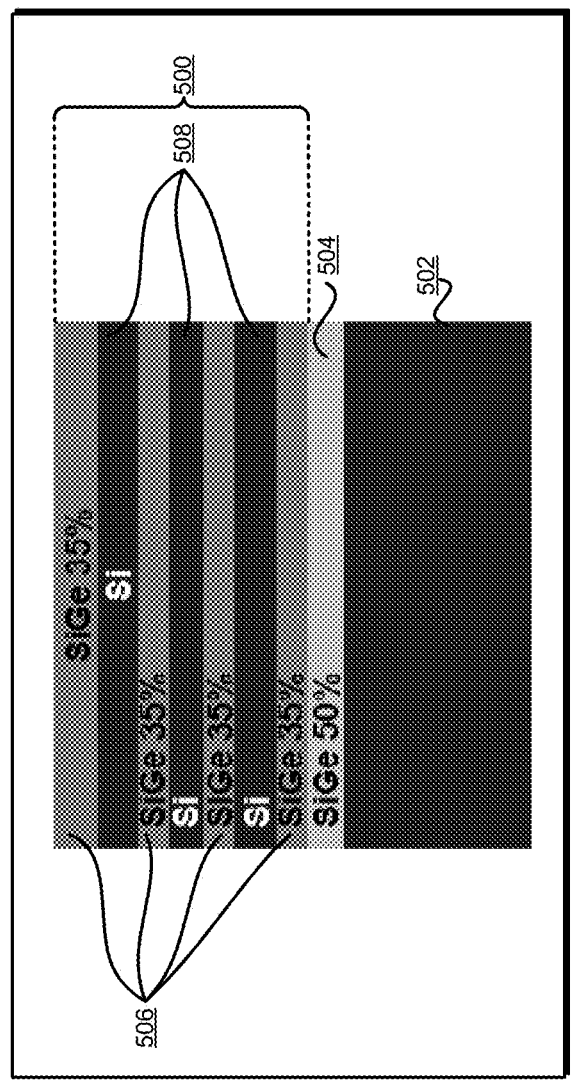
FIG. 5 depicts a step in the fabrication of an improved GAA device in accordance with an illustrative embodiment.

With reference to FIG. 5, this figure depicts a step in the fabrication of an improved GAA device in accordance with an illustrative embodiment. The improved GAA device fabricated using the step on stacked structure 500 is an example of the non-limiting device depicted in schematic 452 in FIG. 4.

Substrate 502 is similar to substrate 320 of FIG. 3. For example, the materials and methods of constructing substrate 502 can be similar to the materials and methods of constructing substrate 320 in FIG. 3.

Stacked structure 500 (also referred to herein as a stacked channel structure) comprises a set of layers. An embodiment deposits or otherwise creates sacrificial layer 504 on a surface of substrate 502 where the GAA device will be fabricated. Sacrificial layer 504 is fabricated from a material that is highly etchable, to wit, is capable of being etched away at greater than a threshold rate.

Continuing building in the same direction, over layer 504, the embodiment deposits or otherwise creates alternating layers of sacrificial material 506 and channel material 508. on a surface of substrate 502 where the GAA device will be fabricated. Sacrificial layers 506 are fabricated from a material that is less etchable than sacrificial layer 504, to wit, is capable of being etched away at or below than the threshold rate. As a non-limiting example, SiGe 50% (Silicon-Germanium with fifty percent Germanium) may be used to construct sacrificial layer 504 and SiGe 35% (Silicon-Germanium with thirty-five percent Germanium) may be used to construct layers 506 because it is known that SiGe 50% etches away faster than SiGe 35%. Channel material 508 may be, but is not limited to Silicon (Si).

Figure 6:
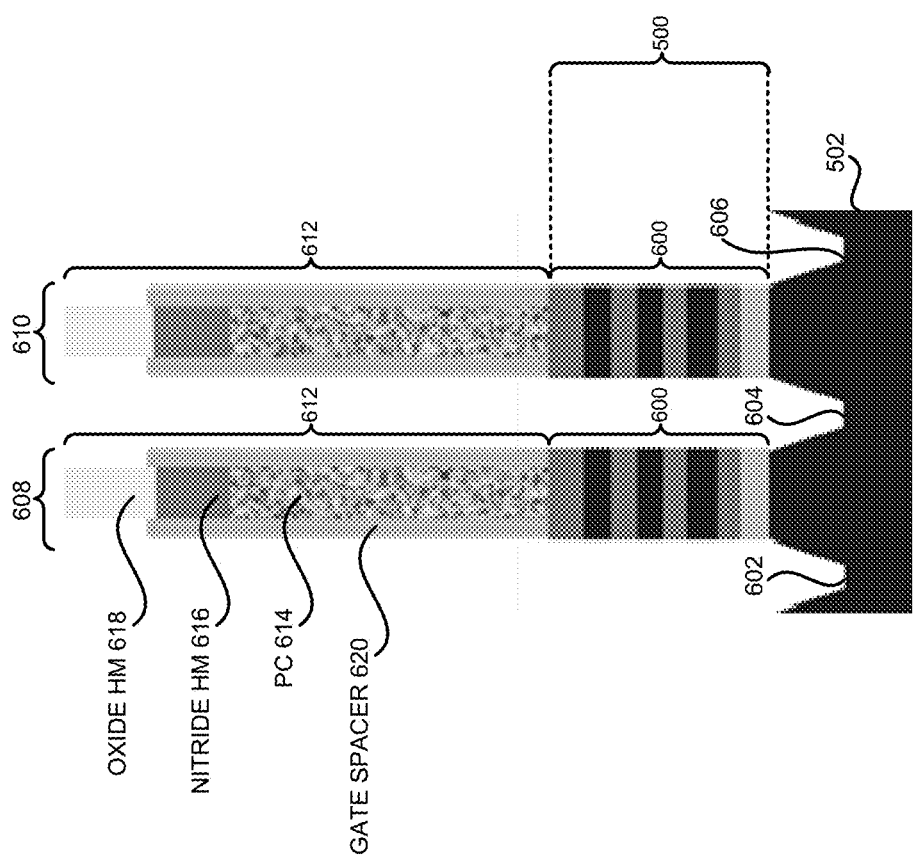
FIG. 6 depicts another step in the fabrication of an improved GAA device in accordance with an illustrative embodiment.

With reference to FIG. 6, this figure depicts another step in the fabrication of an improved GAA device in accordance with an illustrative embodiment. The step depicted in this figure modifies stacked structure 500 in FIG. 5.

An embodiment cuts a plurality of recesses in stacked structure 500 to form one or more stacked structures 600 as shown. For example, to construct two stacked structures 600, recesses 602, 604, and 606 are cut, trenched, or otherwise constructed as shown. Essentially, recesses 602-606 form two example fins 608 and 610, and go at least partially through the total depth of substrate 502.

Recesses 602-606 will eventually be used to fabricate S/D epi structures similar to epi 304 and 306 in FIG. 3. For example, an epi in recess 602 could be the source across fin 608, an epi in recess 602 could be the drain across fin 608 and a source across fin 610, and an epi in recess 608 could be the drain across fin 610. Any number of recesses for a similar purpose can be created without limitation.

Structures 612 are fabricated over stacked structures 500 in fins 608 and 610 using known processes. For example, poly-silicon contact (PC) 614, Nitride (SiN) or similar hard-mask 616, and Oxide (SiO2) or similar hard-mask 618 may be fabricated and protected by gate spacer 620 of a suitable spacer material. PC 614 may also be made as a sacrificial dummy gate material that is removed later and refilled with the gate contact metals. Dielectric materials such as SiN, SiBCN, SiOCN, or other silicon nitride or oxide materials are usable as the spacer material.

Figure 7:
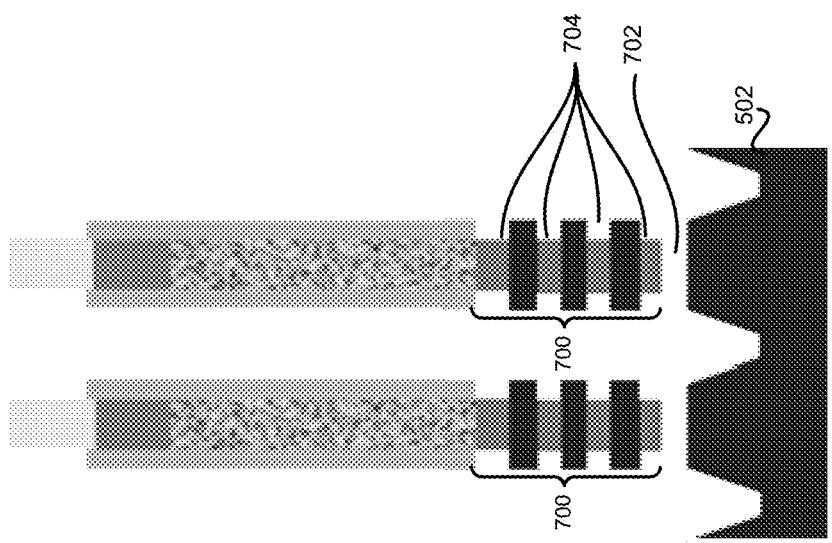
FIG. 7 depicts another step in the fabrication of an improved GAA device in accordance with an illustrative embodiment.

With reference to FIG. 7, this figure depicts another step in the fabrication of an improved GAA device in accordance with an illustrative embodiment. The step depicted in this figure further modifies stacked structure 600 in FIG. 6.

A suitable etching process is applied to stacked structure 600 to erode, dissolve, etch, or otherwise remove sacrificial layer material from structure 600. A non-limiting example of the etching process can be hot SC1 process known to those of ordinary skill in the art. The etching process etches sacrificial layer 504 much faster than sacrificial layers 506 because of the differences in the etching properties of the materials used.

The etching process is applied until layer 504 is completely removed from between remaining structure 700 and substrate 502. Space 702 indicates where layer 504 was located. Indentations 704 show the comparatively reduced depth to which layers 506 have been etched. Etching in this manner exposes the connecting ends of channel layers 508 and optionally some of the lengthwise surface of channel layers 508.

Figure 8:
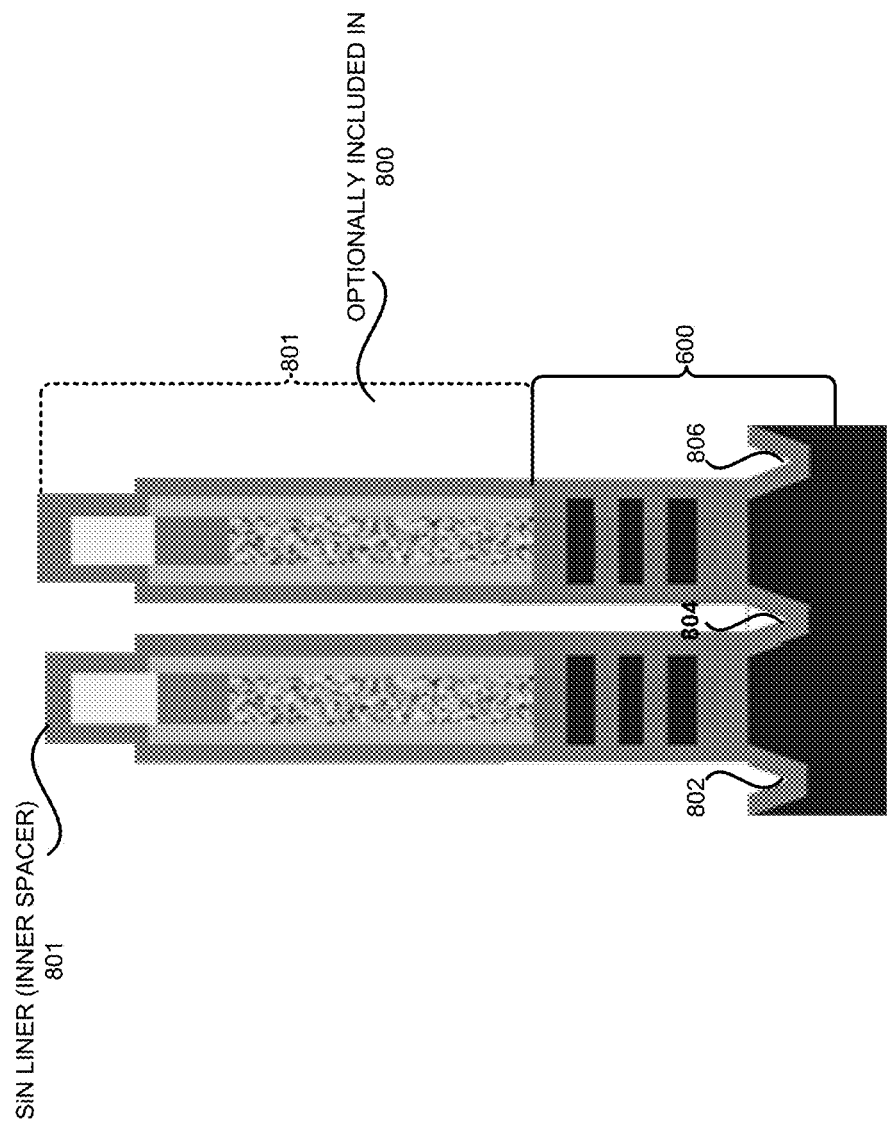
FIG. 8 depicts another step in the fabrication of an improved GAA device in accordance with an illustrative embodiment.

With reference to FIG. 8, this figure depicts another step in the fabrication of an improved GAA device in accordance with an illustrative embodiment. The step depicted in this figure further modifies stacked structure 700 in FIG. 7.

A suitable spacer deposition process is applied to stacked structure 700 to form structure 800. The deposition process deposits, adds, or otherwise fabricates spacer layer 801 on structure 700. As a non-limiting example, spacer layer 801 may be formed using Nitride. Spacer layer 801 is also referred to herein as an inner spacer.

Spacer layer 801 is deposited in such a manner that at least structure 700 and recesses 602, 604, and 606 are covered by a defined thickness of spacer layer 801. Optionally, spacer layer 801 may extend to cover other structures in fins 608 and 610, including but not necessarily the entirety of fins 608 and 610. Accordingly, recess 602 covered by spacer layer 801 transforms to recess 802, recess 604 covered by spacer layer 801 transforms to recess 804, and recess 606 covered by spacer layer 801 transforms to recess 806 as shown. Thus, an instance of structure 800 includes spacer material 801 covering at least an instance of a recess in substrate 502 and an instance of structure 700. Optionally, an instance of structure 800 may also include spacer material 801 covering structure 612 of a fin. Spacer material 801 may be any of a large number of dielectric materials that are known and available in semiconductor fabrication, and may be selected according to suitability in a particular implementation.

Figure 9:
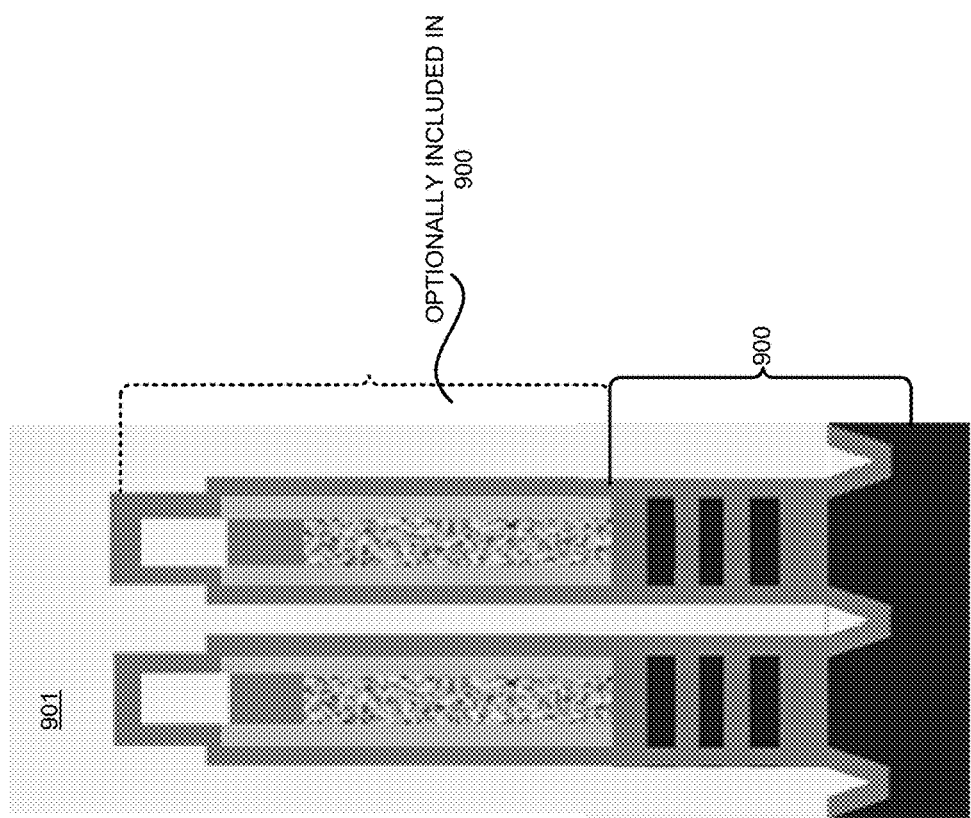
FIG. 9 depicts another step in the fabrication of an improved GAA device in accordance with an illustrative embodiment.

With reference to FIG. 9, this figure depicts another step in the fabrication of an improved GAA device in accordance with an illustrative embodiment. The step depicted in this figure further modifies stacked structure 700 in FIG. 7.

A suitable deposition or filling process is applied to structure 800 to form structure 900. For example, in one embodiment, the process deposits, adds, or otherwise fills an insulator, such as oxide (SiO2) or similar material 901, on structure 800.

Insulator 901 is filled in such a manner that at least structure 800 is covered up to a defined thickness, and recesses 802, 804, and 806 are filled by insulator 901. Optionally, insulator 901 may extend to cover other optionally included portions of structure 800, to form the optionally included portion of structure 900 as shown.

Figure 10:
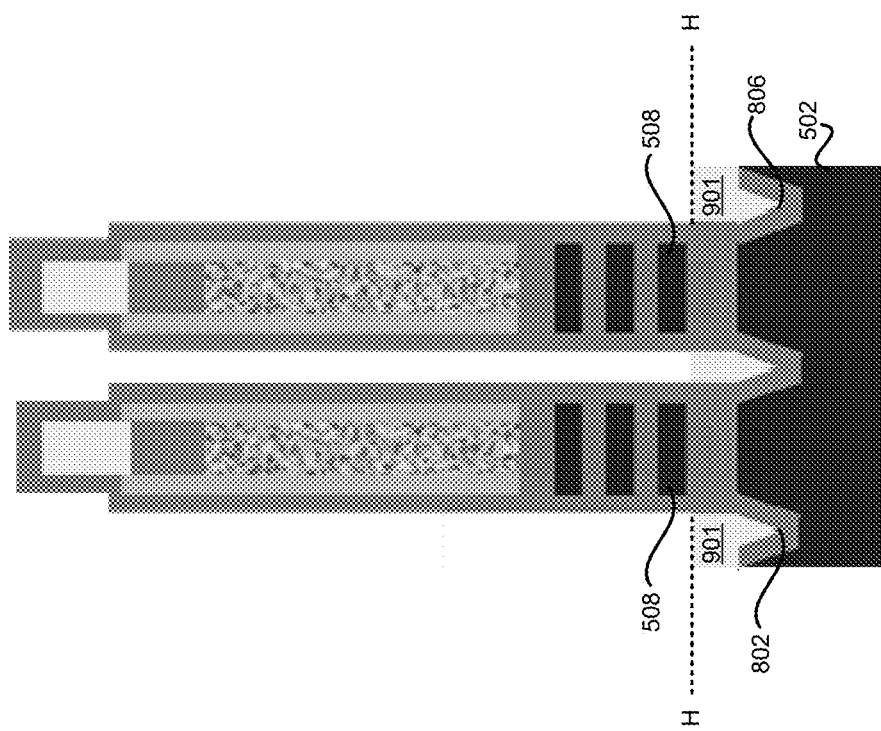
FIG. 10 depicts another step in the fabrication of an improved GAA device in accordance with an illustrative embodiment.

With reference to FIG. 10, this figure depicts another step in the fabrication of an improved GAA device in accordance with an illustrative embodiment. The step depicted in this figure further modifies structure 900 in FIG. 9.

A suitable etching process is applied to structure 900 to erode, dissolve, etch, or otherwise remove insulator from structure 900. A non-limiting example for one part of the etching process can be Chemical Mechanical Planarization (CMP) process known to those of ordinary skill in the art, which is configured to stop at the inner spacer layer 801. A non-limiting example for another part of the etching process can be buffered hydrofluoric acid (BHF) controlled recess at some point below the last channel layer 508 without etching into recesses 802-806. Configured in this manner, the etching process leaves insulator 901 filled at least into recesses 802-806 and optionally up to some height H above the top surface of substrate 502 while remaining below the lowest channel layer 508.

Figure 11:
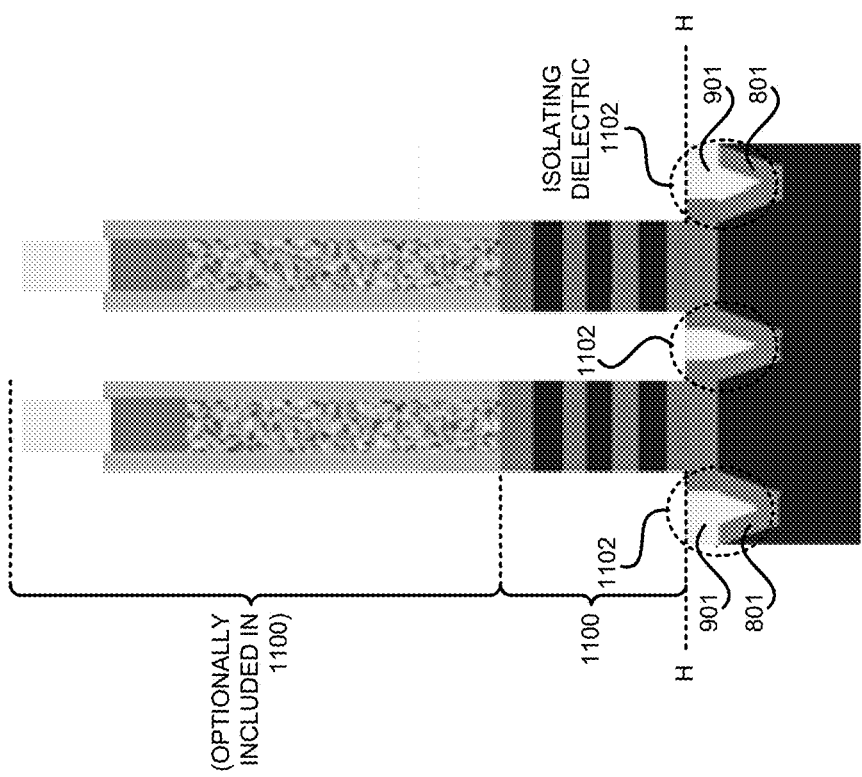
FIG. 11 depicts another step in the fabrication of an improved GAA device in accordance with an illustrative embodiment.

With reference to FIG. 11, this figure depicts another step in the fabrication of an improved GAA device in accordance with an illustrative embodiment. The step depicted in this figure further modifies the remaining portions of structure 900 after the etching process of FIG. 10.

A suitable etching process dissolves, etches, or otherwise removes spacer layer 801 from portion 1100 such that the connection ends of channel layers 508 are exposed and available for electrical connection. Optionally, the etching process also removes spacer layer 801 from structures 612 in fins 608 and 610 as shown.

Due to the presence of insulator 901 from height H and below, the etching process does not remove insulator 901 or spacer layer 801 below height H. The unremoved portions of spacer layer 801 and the unremoved portions of insulator 901 together form isolating dielectric 1102, which is represented as dielectric 454 in FIG. 4, in an improved GAA device according to the illustrative embodiments. This isolating dielectric 1102 operates to electrically isolates substrate 502 from the S/D epis that are grown above them such that a substrate current flow from the epis through substrate 502 faces high resistance of isolating dielectric 1102 and is minimized below an acceptable threshold value.

Figure 12:
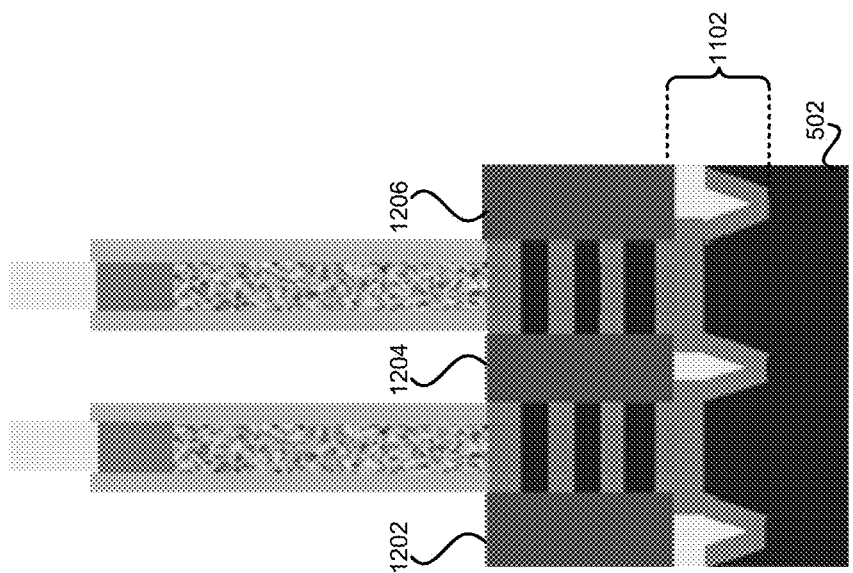
FIG. 12 depicts another step in the fabrication of an improved GAA device in accordance with an illustrative embodiment.

With reference to FIG. 12, this figure depicts another step in the fabrication of an improved GAA device in accordance with an illustrative embodiment. The step depicted in this figure further modifies the exposed ends of channel layers 508 after the formation of isolating dielectric 1102 in FIG. 11.

An epi growth process grows epis 1202, 1204, and 1206 on each exposed end of channel layers 508 to electrically couple the same ends of each channel together. For example, relative to fin 608, epi 1202 is a functional equivalent of epi 304 in FIG. 3 over which contact 308 can be formed, and epi 1204 is a functional equivalent of epi 306 in FIG. 3 over which contact 310 can be formed. Similarly, relative to fin 610, epi 1204 is a functional equivalent of epi 304 in FIG. 3 over which contact 308 can be formed, and epi 1206 is a functional equivalent of epi 306 in FIG. 3 over which contact 310 can be formed.

In some cases, as shown in FIG. 8, parallel structures such as fins 608 and 610 covered with spacer layer 800 cannot maintain a constant distance from one another, e.g., from the top to the bottom of fins 608 and 610. Generally, a tapering occurs such that the distance between fins 608 and 610 at the top becomes greater than the distance between fins 608 and 610 at the bottom. Such tapering is called pinching. Pinching can also be created intentionally by depositing more spacer liner material at the bottom—near the recess in substrate 502—as compared to an amount of spacer liner material deposited towards the top—away from the recess in substrate 502.

Figure 13:
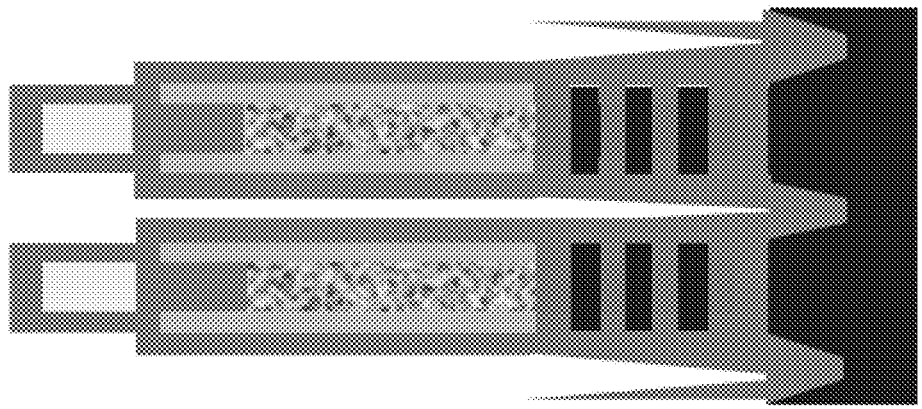
FIG. 13 depicts a manner of pinching of structures in accordance with an illustrative embodiment.

FIG. 13 depicts a manner of pinching of structures in accordance with an illustrative embodiment. The pinching depicted in this figure can be an unintended unevenness caused by the fabrication process, or can be formed intentionally by depositing different thicknesses of nitride from the top to the bottom of fins 608 and 610.

When pinching has occurred, or has been caused to occur, recess 802, 804, and 806 may not have available space to be filled by insulator 901. In such cases, insulator 901 may not occupy any space within the substrate boundary and may simply deposit over the pinched recesses.

Figure 14:
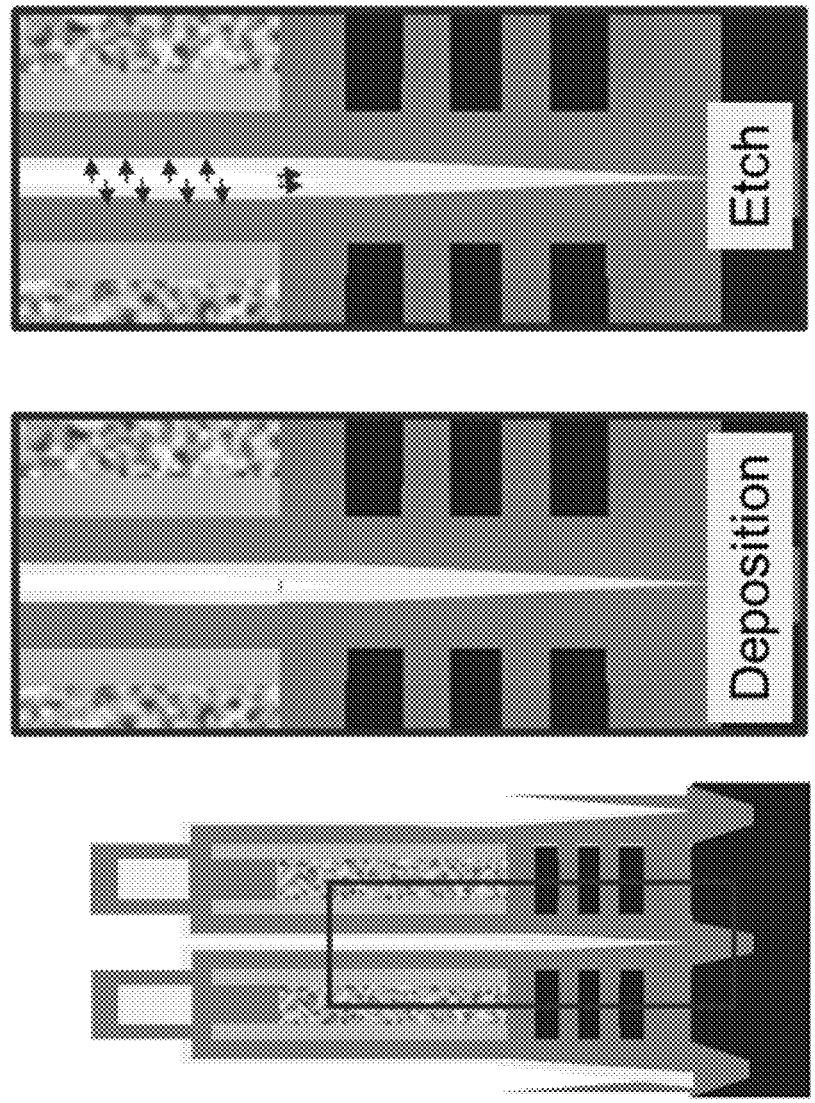
FIG. 14 depicts an example manner of insulator deposition and etching in pinched structures in accordance with an illustrative embodiment.

FIG. 14 depicts an example manner of insulator deposition and etching in pinched structures in accordance with an illustrative embodiment. As compared to FIG. 9, during conformal insulator deposition, the bottom of the valley formed by the pinching is going to be filled by the insulator material, such as oxide, due to the tapered profile. This phenomenon is called dielectric pinch-off. as a result, when the etching of FIG. 10 occurs, the bottom of the filled valley will be slightly recessed and some insulator will remain on the nitride layer due to the small exposure area, while other exposed surfaces of the insulator are cleaned up to the spacer layer as shown.

Figure 15:
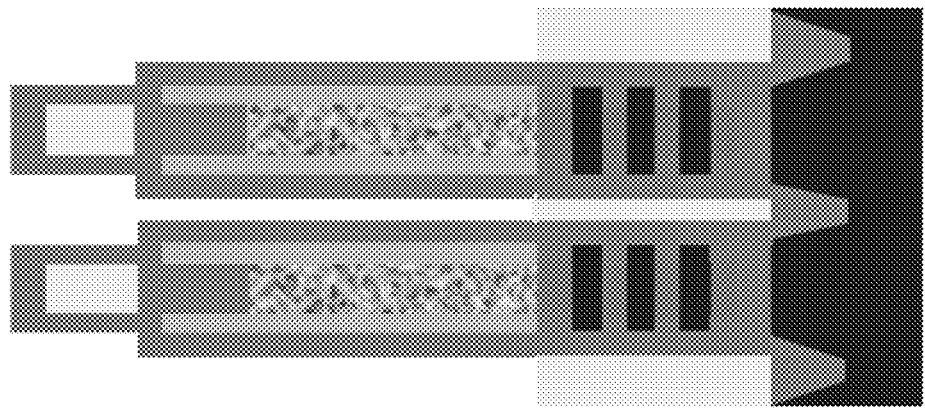
FIG. 15 depicts refilling the recess in the insulator created in pinched areas in accordance with an illustrative embodiment.

FIG. 15 depicts refilling the recess in the insulator created in pinched areas in accordance with an illustrative embodiment. An embodiment deposits a suitable insulator in the insulator recess formed in FIG. 14. The deposition may use iRAD or high-density plasma (HDP) to deposit the insulator, such as SiO2 in the insulator valley. Thereafter, the insulator etching is performed in the manner of FIG. 10. Thereafter, the embodiment progresses as described in FIG. 11 et seq.

Figure 16:
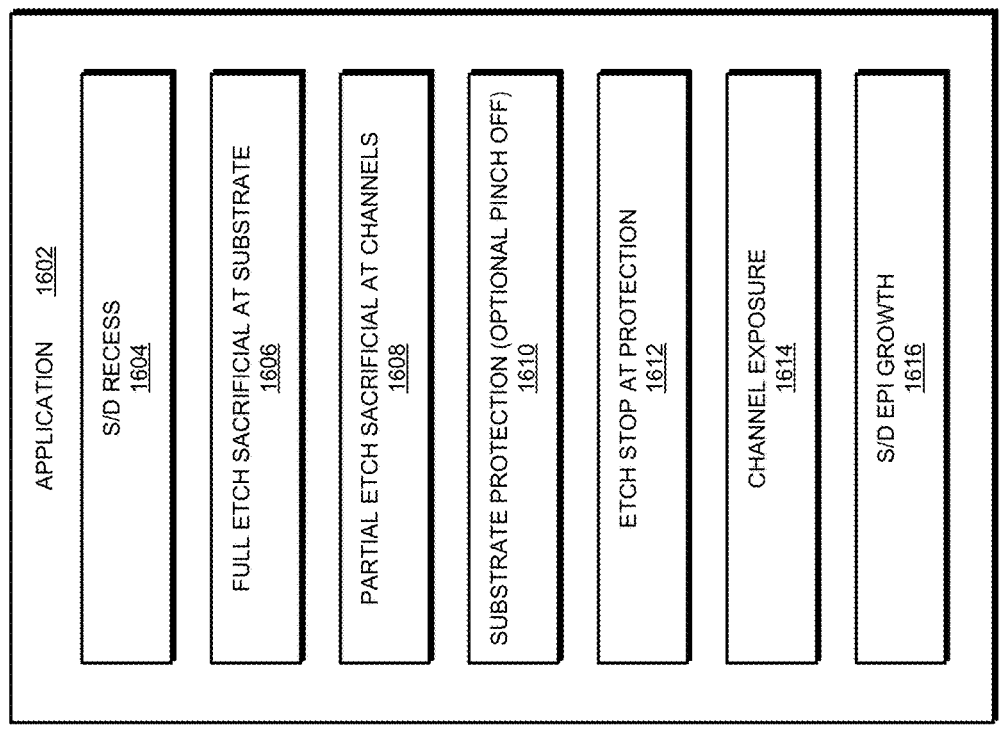
FIG. 16 depicts a block diagram of an example application for fabricating dielectric isolation in GAA devices in accordance with an illustrative embodiment.

With reference to FIG. 16, this figure depicts a block diagram of an example application for fabricating dielectric isolation in GAA devices in accordance with an illustrative embodiment. Application 1602 can be implemented as application 105 in FIG. 1.

Application 1602 is configured to perform a suitable combination and order of the steps described from FIGS. 5-15, as may be suitable in a given implementation. For example, component 1604 causes a fabrication system to construct the layers as described in FIG. 5, and form the recesses as shown in FIG. 6.

Component 1606 causes the highly etchable sacrificial layer to be etched fully between the substrate and the layers above as shown in FIG. 7. Component 1608 causes the less etchable sacrificial layers partially around and between the channel layers, as shown in FIG. 7.

Component 1610 causes the spacer layer (protection layer) to be deposited, as in FIG. 8. Any intentional or unintentional pinch-off occurs in the operation of component 1610 as well, as described in FIG. 13. Component 1610 fills the insulator as described in FIG. 9 and FIG. 14 depending on the pinch-off circumstance.

Component 1612 causes an etching of the insulator to occur, stopping the etching at height H and at the spacer (protection) layer, as shown in FIG. 10. Component 1614 causes the channel layer connection ends to become exposed through the removal of the protection layer from that area, as shown in FIG. 11. Component 1616 causes S/D epis to be grown at the exposed channel ends in the manner of FIG. 12.

Figure 17:
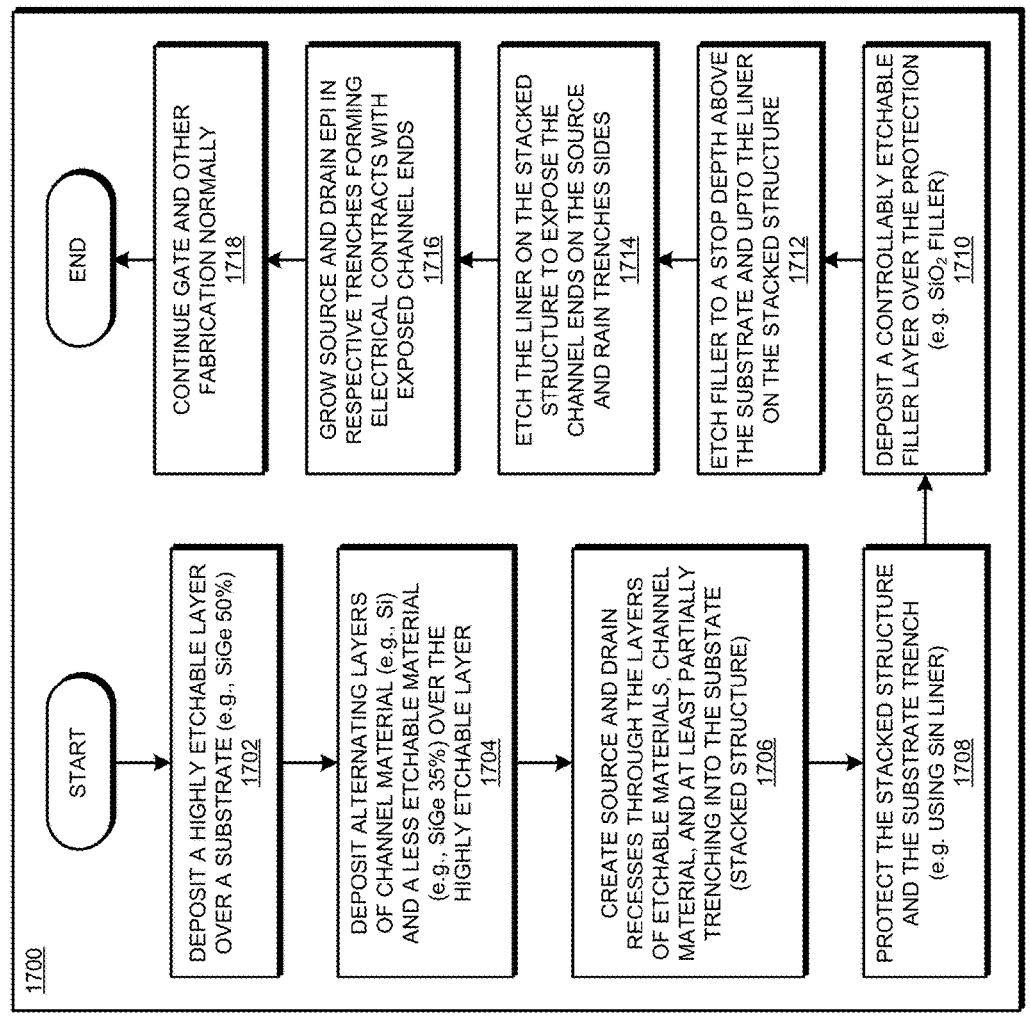
FIG. 17 depicts a flowchart of an example process for dielectric isolation in GAA devices in accordance with an illustrative embodiment.

With reference to FIG. 17, this figure depicts a flowchart of an example process for dielectric isolation in GAA devices in accordance with an illustrative embodiment. Process 1700 can be implemented in application 1602 in FIG. 16.

The application deposits a highly etchable layer over a substrate (block 1702). The application deposits alternating layers of channel material and a less etchable material over the highly etchable layer (block 1704).

The application creates a source recess and a drain recess through the layers, channel material and at least partially into the substrate forming a stacked structure (block 1706). The application protects the stacked structure and the substrate trench using a spacer liner (block 1708). The application deposits a controllably etchable insulator filler over the spacer layer (block 1710).

The application etches the filler up to a stop depth above the substrate and up to the spacer liner on the stacked structure (block 1712). The application etches the liner on the stacked structure to expose the connection ends of the channel layers on the trench sides (block 1714).

The application grows S/D epis in the trenches to electrically connect the channel ends that are on the same side of the stacked structure (block 1716). The application continues the gate and other fabrication as needed (block 1718). The application ends process 1700 thereafter.

What is claimed is:

1. A semiconductor device comprising:
a first layer comprising a first sacrificial material, wherein the first layer is deposited, over a surface of a substrate;
a first set of layers of a second sacrificial material and a second set of layers of a channel material deposited over the first layer, wherein the first sacrificial material is etchable by a process at a first rate, wherein the second sacrificial material is etchable by the process at a second rate, and wherein the first rate is greater than the second rate;
a liner deposited in a first recess, wherein the first recess exposes a first connection end of a layer in the second set, wherein the first recess reaches into the substrate for at least a fraction of a total depth of the substrate;
an insulator material filling the first recess,
wherein etching is performed on the insulator material up to a stop depth, wherein the stop depth stops the etching at a height above the surface of the substrate,
wherein the liner is removed from at least the first connection end of the layer in the second set; and
an electrical connection formed with a source/drain structure using the first connection end of the layer in the second set, wherein a remaining portion of the insulator below the height and a remaining portion of the liner in the first recess electrically isolates the source/drain structure from the substrate and increases impedance in a path of a substrate current from the source/drain structure to the substrate.

2. The semiconductor device of claim 1, further comprising:
an epitaxy structure grown in electrical connection with the first connection end of the layer in the second set, wherein the epitaxy structure operates as the source/drain structure.

3. The semiconductor device of claim 1, wherein the height above the substrate is zero.

4. The semiconductor device of claim 1, wherein the height above the surface of the substrate reaches up to a substrate-facing surface of a bottom-most layer in the second set of layers.

5. The semiconductor device of claim 1, wherein the first layer, the first set of layers, and the second set of layers together form a stack of layers, further comprising:
the first recess and a second recess formed by recessing the stack of layers, wherein the second recess exposes a second connection end of the layer in the second set, the second connection end being on an opposite side from the connection end, wherein the first recess and the second recess each reaches into the substrate for at least the fraction of the total depth of the substrate.

6. The semiconductor device of claim 1, wherein a second layer immediately adjacent to the first layer comprises the second sacrificial material.

7. The semiconductor device of claim 1, wherein a second layer immediately adjacent to the first layer comprises the channel material.

8. The semiconductor device of claim 1, wherein the set of layers of the channel material includes a plurality of layers.

9. A method comprising:
depositing, over a surface of a substrate, a first layer comprising a first sacrificial material;
depositing, over the first layer, a first set of layers of a second sacrificial material and a second set of layers of a channel material, wherein the first sacrificial material is etchable by a process at a first rate, wherein the second sacrificial material is etchable by the process at a second rate, and wherein the first rate is greater than the second rate;
depositing a liner in a first recess, wherein the first recess exposes a first connection end of a layer in the second set, wherein the first recess reaches into the substrate for at least a fraction of a total depth of the substrate;
filling the first recess with an insulator material;
etching the insulator material up to a stop depth, wherein the stop depth stops the etching at a height above the surface of the substrate;
removing the liner from at least the first connection end of the layer in the second set; and
enabling the first connection end of the layer in the second set to form an electrical connection with a source/drain structure, wherein a remaining portion of the insulator below the height and a remaining portion of the liner in the first recess electrically isolates the source/drain structure from the substrate and increases impedance in a path of a substrate current from the source/drain structure to the substrate.

10. The method of claim 9, further comprising:
growing an epitaxy structure in electrical connection with the first connection end of the layer in the second set, wherein the epitaxy structure operates as the source/drain structure.

11. The method of claim 9, wherein the height above the substrate is zero.

12. The method of claim 9, wherein the height above the surface of the substrate reaches up to a substrate-facing surface of a bottom-most layer in the second set of layers.

13. The method of claim 9, wherein the first layer, the first set of layers, and the second set of layers together form a stack of layers, further comprising:
recessing the stack of layers to form the first recess and a second recess, wherein the second recess exposes a second connection end of the layer in the second set, the second connection end being on an opposite side from the connection end, wherein the first recess and the second recess each reaches into the substrate for at least the fraction of the total depth of the substrate.

14. The method of claim 9, wherein a second layer immediately adjacent to the first layer comprises the second sacrificial material.

15. The method of claim 9, wherein a second layer immediately adjacent to the first layer comprises the channel material.

16. The method of claim 9, wherein the set of layers of the channel material includes a plurality of layers.

17. A semiconductor fabrication system comprising a lithography component, the semiconductor fabrication system when operated on a wafer to fabricate a semiconductor device performing operations the comprising:
  depositing, over a surface of a substrate, a first layer comprising a first sacrificial material;
  depositing, over the first layer, a first set of layers of a second sacrificial material and a second set of layers of a channel material, wherein the first sacrificial material is etchable by a process at a first rate, wherein the second sacrificial material is etchable by the process at a second rate, and wherein the first rate is greater than the second rate;
  depositing a liner in a first recess, wherein the first recess exposes a first connection end of a layer in the second set, wherein the first recess reaches into the substrate for at least a fraction of a total depth of the substrate;
  filling the first recess with an insulator material;
  etching the insulator material up to a stop depth, wherein the stop depth stops the etching at a height above the surface of the substrate;
  removing the liner from at least the first connection end of the layer in the second set; and
  enabling the first connection end of the layer in the second set to form an electrical connection with a source/drain structure, wherein a remaining portion of the insulator below the height and a remaining portion of the liner in the first recess electrically isolates the source/drain structure from the substrate and increases impedance in a path of a substrate current from the source/drain structure to the substrate.

18. The semiconductor fabrication system of claim 17, further comprising:
  growing an epitaxy structure in electrical connection with the first connection end of the layer in the second set, wherein the epitaxy structure operates as the source/drain structure.

* * * * *